United States Patent
Tozawa et al.

(10) Patent No.: US 9,466,507 B2
(45) Date of Patent: Oct. 11, 2016

(54) ETCHING METHOD, AND RECORDING MEDIUM

(71) Applicant: TOKYO ELECTRON LIMITED, Tokyo (JP)

(72) Inventors: Shigeki Tozawa, Tokyo (JP); Tomoaki Ogiwara, Gyeonggi-do (KR)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 14/900,877

(22) PCT Filed: Jun. 13, 2014

(86) PCT No.: PCT/JP2014/065736
§ 371 (c)(1),
(2) Date: Dec. 22, 2015

(87) PCT Pub. No.: WO2014/208365
PCT Pub. Date: Dec. 31, 2014

(65) Prior Publication Data
US 2016/0163562 A1 Jun. 9, 2016

(30) Foreign Application Priority Data
Jun. 25, 2013 (JP) .................. 2013-132530

(51) Int. Cl.
*H01L 21/311* (2006.01)
(52) U.S. Cl.
CPC ................ *H01L 21/31116* (2013.01)
(58) Field of Classification Search
CPC .................................. H01L 21/31116
USPC .................................. 438/706, 734
See application file for complete search history.

(56) References Cited

U.S. PATENT DOCUMENTS

2010/0240218 A1* 9/2010 Ugajin .............. H01L 21/76814
438/706

FOREIGN PATENT DOCUMENTS

| JP | 2007-180418 A | 7/2007 |
|---|---|---|
| JP | 2009-094307 A | 4/2009 |
| JP | 2010-245512 A | 10/2010 |
| WO | 2012-063901 A1 | 5/2012 |

OTHER PUBLICATIONS

International Search Report dated Dec. 2, 2014 corresponding to International application No. PCT/JP2014/065736.

* cited by examiner

*Primary Examiner* — Roberts Culbert
(74) *Attorney, Agent, or Firm* — Nath, Goldberg & Meyer; Jerald L. Meyer

(57) ABSTRACT

An etching method includes a modification process of supplying a mixture gas to a surface of a silicon oxide film, modifying the silicon oxide film to generate a reaction product, and a heating process of heating and removing the reaction product. The modification process includes a first modification process of supplying the mixture gas containing a gas including a halogen element and an alkaline gas to the surface of the silicon oxide film, and a second modification process of stopping supplying the alkaline gas and supplying the mixture gas containing the gas including the halogen element to the surface of the silicon oxide film.

11 Claims, 9 Drawing Sheets

ETCHING METHOD, AND RECORDING MEDIUM

TECHNICAL FIELD

The present disclosure relates to an etching method and a recording medium.

BACKGROUND

In a semiconductor device manufacturing process, a method has been known, which dry-etches a silicon oxide film existing in a surface of a semiconductor wafer (hereinafter referred to as "wafer") without using plasma. Such a dry-etching method includes: a modification process in which a reaction product is generated by supplying a mixture gas including a hydrogen fluoride gas (HF) and an ammonia gas ($NH_3$) into a chamber in which the wafer is received while controlling an interior of the chamber to have a low pressure close to a vacuum state and adjusting a temperature of the wafer to a predetermined temperature, thereby modifying the silicon oxide film; and a heating process in which the reaction product is heated so as to be vaporized (sublimated). The dry-etching method etches the silicon oxide film by modifying the surface of the silicon oxide film to the reaction product and removing the reaction product by heating (see Patent Documents 1 and 2).

The etching process described above is applied to, for example, a process for etching a sacrificial oxide film of a wafer W having a structure shown in FIG. 1. As shown in FIG. 1, in the wafer W, a HDP-$SiO_2$ film 101, which is an interlayer insulating film, is formed on a surface of a Si layer 100. In a surface of the HDP-$SiO_2$ film 101, a resist film 102 is formed. Moreover, in the HDP-$SiO_2$ film 101, a groove H (e.g., a contact hole) is formed, and a sacrificial oxide film 103 is formed in a lower portion of the groove H. Further, a SiN film 104, which is an insulator, is formed in a side wall portion of the groove H.

PRIOR ART DOCUMENTS

Patent Documents

Patent Document 1: Japanese Patent Application Publication No. 2007-180418

Patent Document 2: Japanese Patent Application Publication No. 2009-94307

However, if etching of the sacrificial oxide film 103 in the lower portion of the groove of the wafer W is performed, in the conventional dry-etching method including the etching method described in Patent Documents 1 and 2, a reaction between the sacrificial oxide film 103 and the mixture gas in the modification process becomes slow along with a processing time, and a modification amount of the sacrificial oxide film 103 with respect to the processing time goes to a saturation state.

This phenomenon is caused by a reaction product (ammonium fluorosilicate) generated by a reaction between the ammonia gas in the mixture gas and the sacrificial oxide film 103. The reaction product 105 is formed to become thicker in proportion to a modification processing time of the sacrificial oxide film 103 in the modification process. When the mixture gas passes through the reaction product formed to be thick in that manner, a passing speed of the mixture gas is lowered, so that it becomes difficult for the mixture gas to reach the sacrificial oxide film 103 in the lower portion of the groove. For these reasons, it becomes difficult to modify the sacrificial oxide film 103 in the lower portion of the groove, so that, while the reaction product 105 is sublimated in the subsequent heating process, the unmodified sacrificial oxide film 103 remains.

Moreover, as shown in FIG. 2, in the conventional etching method, the sacrificial oxide film 103 tends to be more modified in a peripheral portion of the lower portion of the groove than a central portion of the lower portion of the groove. For these reason, if the modification process is ended at a timing when, for example, the sacrificial oxide film 103 in the central portion of the lower portion of the groove is completely removed, the sacrificial oxide film 103 remains in the peripheral portion of the lower portion of the groove.

If the sacrificial oxide film 103 cannot be removed sufficiently in the etching process, a film thickness of a gate oxide film to be formed in a subsequent process is reduced by a thickness of the remaining sacrificial oxide film 103. As a result, an effective channel length is shortened, so that performance as a semiconductor deteriorates. In order to avoid such a situation, the sacrificial oxide film 103 in the lower portion of the groove needs to be removed uniformly and sufficiently in the etching process of the sacrificial oxide film 103. In other words, the sacrificial oxide film 103 in the lower portion of the groove needs to be modified uniformly and sufficiently in the modification process of the etching process.

As described above, although the modification reaction between the sacrificial oxide film 103 and the mixture gas becomes slow as the modification processing time passes, all of the sacrificial oxide film 103 in the peripheral portion of the lower portion of the groove can be modified by increasing the modification processing time. However, if the modification processing time is increased, the modification reaction occurs even in a top surface portion of the HDP-$SiO_2$ film 101, so that a desired film thickness cannot be obtained.

Moreover, as an alternative, a method is available, in which the reaction product 105 is sublimated once in a step in which a production amount of the reaction product 105 is increased, and then the modification of the sacrificial oxide film 103 is performed by supplying the mixture gas again. However, since heating of the wafer W is needed to sublimate the reaction product 105, heating in the chamber or a heating process in which the wafer W is transferred to a separate heating chamber should be included in the modification process, thereby spending time for removal of the sacrificial oxide film 103. Further, in some cases, it is necessary to repeatedly perform the modification process and the heating process several times so as to sufficiently modify the sacrificial oxide film 103. Thus, the etching process has reduced productivity.

The present disclosure is made in consideration of the above situation. The object of the present disclosure is to provide an etching method which can uniformly and sufficiently etch a silicon oxide film formed in a wafer.

SUMMARY

In order to solve the problem, according to the present disclosure, there is provided an etching process including: a modification process of supplying a mixture gas to a surface of a silicon oxide film to cause a chemical reaction between the silicon oxide film and the mixture gas, and modifying the silicon oxide film to generate a reaction product; and a heating process of heating and removing the reaction product, wherein the modification process includes: a first modification process of supplying the mixture gas containing a gas including a halogen element and an alkaline gas to the surface of the silicon oxide film; and a second modification process of stopping supplying the alkaline gas and supplying the mixture gas containing the gas including the halogen element to the surface of the silicon oxide film.

Moreover, according to the present disclosure, there is provided a recording medium storing a program which can be executed by a controller computer of a processing system, wherein the program is executed by the controller computer to cause the etching method to be performed in the processing system.

Effect of Some Embodiments of the Present Disclosure

According to the present disclosure, a sacrificial oxide film formed on a wafer can be modified uniformly and sufficiently by performing a second modification step after a first modification step. As a result, the sacrificial oxide film can be removed uniformly and sufficiently without a remaining sacrificial oxide film by sublimating a reaction product in a subsequent heating process.

DETAILED DESCRIPTION

Figure 1:
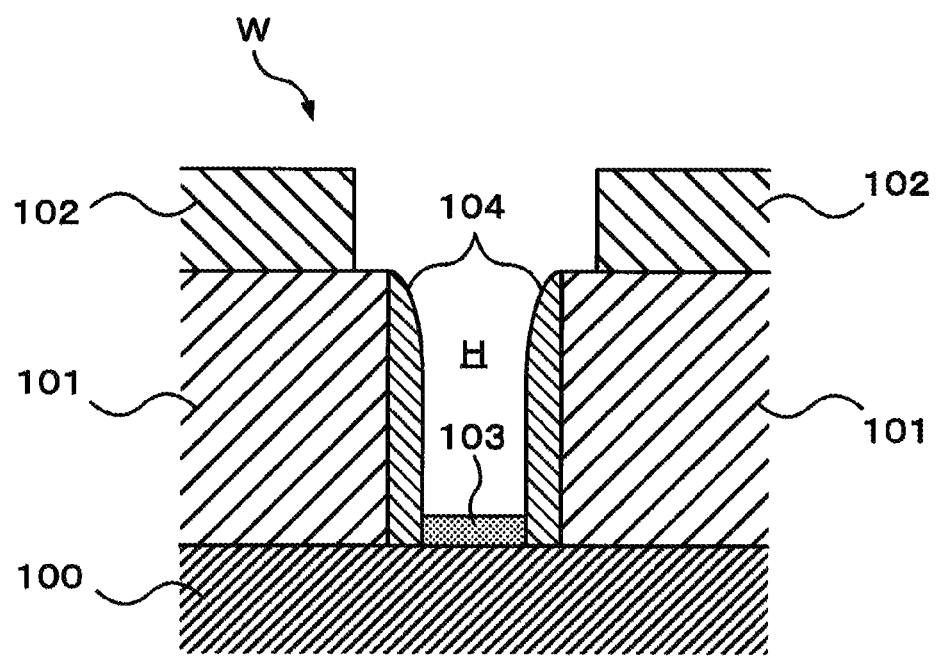
FIG. 1 is a schematic vertical sectional view illustrating a structure of a surface of a wafer (a face on which a device is formed) before performing an etching of a sacrificial oxide film.

Hereinafter, a suitable embodiment of the present disclosure will be described. First, a condition of a wafer which is a substrate processed by an etching method related to the present embodiment. As shown in FIG. 1, a wafer W is, for example, a silicon wafer formed in a substantially disc-shaped thin plate, and has, for example, a HDP-$SiO_2$ film (silicon oxide film) 101 formed on a surface of a silicon (Si) layer 100. The HDP-$SiO_2$ film 101 is a CVD-based silicon oxide film (plasma CVD oxide film) formed by using a bias high-density plasma CVD method (HDP-CVD method), and is used as an interlayer insulating film.

In a gap in the HDP-$SiO_2$ film 101, a contact hole H is formed. In a side wall portion of the contact hole H, for example, a SiN film 104, which is an insulator, is formed. A lower portion of the SiN film 104 is formed extending to such a position as to contact a top surface of the wafer W. Further, in a lower portion of the contact hole H, a sacrificial oxide film 103, which is an example of a silicon oxide film, is formed.

Next, a processing system which performs an etching process to the sacrificial oxide film 103 formed in the lower portion of the contact hole H with respect to the wafer W will be described. The processing system 1 shown in FIG. 3 includes a loading/unloading part 2 which loads/unloads the wafer W with respect to a processing system 1, two load lock chambers 3 which is installed adjacent to the loading/unloading part 2, post heat treatment (PHT) processing apparatuses 4 which are respectively installed adjacent to each of the load lock chambers 3 and performs a PHT process as a heating process, chemical oxide removal (COR) processing apparatuses 5 which are respectively installed adjacent to each of the PHT processing apparatuses 4 and performs a COR process as a modification process, and a controller computer 8 which sends control commands to respective parts of the processing system 1. The PHT processing apparatuses 4 and the COR processing apparatuses 5 connected to each of the load lock chambers 3, respectively, are arranged and installed in this order from the load lock chambers 3 side.

The loading/unloading part 2 includes a transfer chamber 12. A first wafer transfer mechanism 11 transferring the wafer W, having, e.g., a substantially disk shape, is installed in the transfer chamber 12. The first wafer transfer mechanism 11 includes two transfer arms 11a and 11b which substantially horizontally hold the wafer W. In one side of the transfer chamber 12, a mounting table 13 (e.g., three) on which carriers 13a are mounted is provided. Each of the carriers 13a is capable of accommodating a plurality of sheets of wafers W arranged therein. Further, an orienter 14 which performs position alignment by optically obtaining eccentric amounts through the rotation of the wafer W is installed.

In the loading/unloading part 2, with an operation of the wafer transfer mechanism 11, the wafer W is rotated and moved straight in a substantially horizontal plane, and is vertically moved while being held by the transfer arms 11a and 11b, thereby being transferred to a desired position. Further, the transfer arms 11a and 11b move to/from the carriers 13a mounted on the mounting table 13, the orienter 14, and the load lock chambers 3 respectively, for loading/unloading.

The load lock chambers 3 are respectively connected to the transfer chamber 12 through gate valves 16 each installed between load lock chamber 3 and the transfer chamber 12. In each of the load lock chambers 3, a second wafer transfer mechanism 17 which transfers the wafer W is installed. The wafer transfer mechanism 17 includes a transfer arm 17a which substantially horizontally holds the wafer W. Further, the load lock chambers 3 are capable of being vacuumized.

In the load lock chambers 3, with an operation of the wafer transfer mechanism 17, the wafer W is rotated and moved straight in a substantially horizontal plane, and is vertically moved while being held by the transfer arm 17a, thereby being transferred. Moreover, when the transfer arm 17a moves to/from the PHT processing apparatus 4 longitudinally connected to each of the load lock chambers 3, the wafer W is loaded/unloaded with respect to the PHT processing apparatus 4. Further, when the transfer arm 17a moves to/from the COR processing apparatus 5 through each of the PHT processing apparatuses 4, the wafer W is loaded/unloaded with respect to the COR processing apparatus 5.

The PHT processing apparatus 4 includes a processing chamber (processing space) 21 which has an air-tight structure and receives a wafer W. Moreover, while not shown, a loading/unloading gate is formed to load/unload the wafer W with respect to an interior of the processing chamber 21. A gate valve 22 which opens/closes the loading/unloading gate is installed. The processing chamber 21 is connected to the load lock chamber 3 with gate valves 22 interposed between the processing chamber 21 and the load lock chamber 3.

Figure 4:
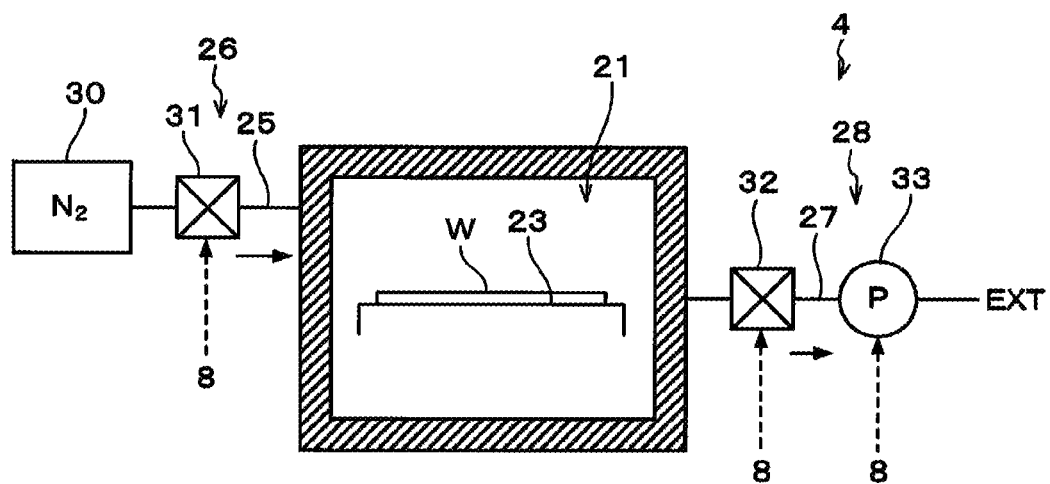
FIG. 4 is an explanation drawing illustrating a configuration of a PHT processing apparatus.

As shown in FIG. 4, in the processing chamber 21 of the PHT processing apparatus 4, a mounting table 23 on which the wafer W is substantially horizontally mounted is installed. Moreover, a supply mechanism 26 and an exhaust mechanism 28 are installed. The supply mechanism 26 includes a supply path 25 through which an inert gas such as nitrogen gas $N_2$ or the like is heated and supplied to the processing chamber 21. The exhaust mechanism 28 includes an exhaust path 27 for exhausting the processing chamber 21. The supply path 25 is connected to a nitrogen gas supply source 30. Further, in the supply path 25, a flow rate adjusting valve 31, which is capable of performing an open/close operation of the supply path 25 and controlling a supply flow rate of the nitrogen gas, is installed. In the exhaust path 27, an open/close valve 32 and an exhaust pump 33 for performing forced exhaust are installed.

Moreover, operations of respective parts such as the gate valve 22, the flow rate adjusting valve 31, the open/close valve 32, the exhaust pump 33 and so forth in the PHT processing apparatus 4 are controlled by control commands of the controller computer 8, respectively. In other words, the controller computer 8 controls the supply of the nitrogen gas by the supply mechanism 26, the exhaust by the exhaust mechanism 28 and so forth.

Figure 5:
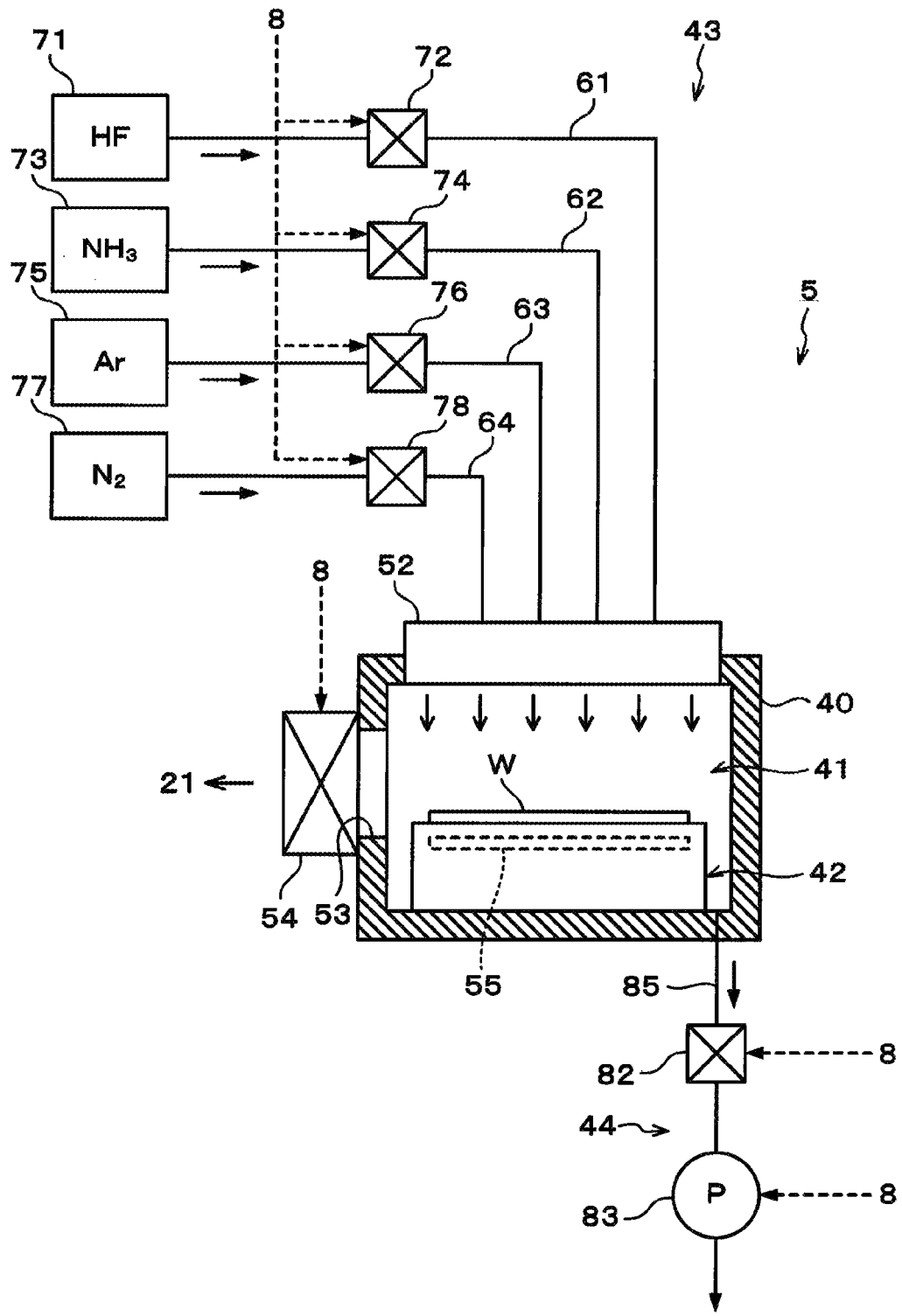
FIG. 5 is an explanation drawing illustrating a configuration of a COR processing apparatus.

As shown in the FIG. 5, the COR processing apparatus 5 includes a chamber 40 which has an air-tight structure. An interior of the chamber 40 is defined as a processing chamber (processing space) 41 in which the wafer W is received. A mounting table 42 on which the wafer W is substantially horizontally mounted is installed inside of the chamber 40. Moreover, in the COR processing apparatus 5, a supply mechanism 43 supplying a gas to the processing chamber 41 and an exhaust mechanism 44 exhausting an interior of the processing chamber 41 are installed.

In a side wall portion of the chamber 40, a loading/unloading gate 53 for loading/unloading the wafer W into/out of the interior of the processing chamber 41 is installed, and a gate valve 54 for opening/closing the loading/unloading gate 53 is formed. The processing chamber 41 is connected to the processing chamber 21 of the PHT processing apparatus 4 with the gate valve 54 interposed between the processing chamber 41 and the processing chamber 21. A ceiling portion of the chamber 40 includes a shower head 52 having a plurality of discharge holes discharging a processing gas.

The mounting table 42 has a substantially circular shape when viewed from a plan view, and is fixed to a lower portion of the chamber 40. Within the mounting table 42, a temperature controller 55 which controls a temperature of the mounting table is installed. The temperature controller 55 includes a pipe line through which, for example, temperature control liquid (e.g., water and so forth) is circulated, whereby a temperature of a top surface of the mounting table 42 is controlled by heat exchange with the liquid flowing inside of the pipe line. A temperature of the wafer W is controlled by heat exchange between the mounting table 42 and the wafer W on the mounting table 42. Moreover, the temperature controller 55 is not limited to this type, but may be, for example, an electric heater heating the mounting table 42 and the wafer W by using resistance heat, or the like.

The supply mechanism 43 includes the aforementioned shower head 52, a hydrogen fluoride gas supply path 61 for supplying a hydrogen fluoride gas (HF) to the processing chamber 41, an ammonia gas supply path 62 for supplying an ammonia gas ($NH_3$) to the processing chamber 41, an argon gas supply path 63 for supplying an argon gas (Ar) as an inert gas to the processing chamber 41, and a nitrogen gas supply path 64 for supplying nitrogen gas ($N_2$) as an inert gas to the processing chamber 41. The hydrogen fluoride gas supply path 61, the ammonia gas supply path 62, the argon gas supply path 63, and the nitrogen gas supply path 64 are connected to the shower head 52, and thus the hydrogen fluoride gas, ammonia gas, argon gas, nitrogen gas are spread and discharged through the shower head 52 into the processing chamber 41.

The hydrogen fluoride gas supply path 61 is connected to a hydrogen fluoride gas supply source 71. Further, in the hydrogen fluoride gas supply path 61, a flow rate adjusting valve 72, which is capable of performing an open/close operation of the hydrogen fluoride gas supply path 61 and controlling a supply flow rate of the hydrogen fluoride gas, is installed. The ammonia gas supply path 62 is connected to an ammonia gas supply source 73. Further, in the ammonia gas supply path 62, a flow rate adjusting valve 74, which is capable of performing an open/close operation of the ammonia gas supply path 62 and controlling a supply flow rate of the ammonia gas, is installed. The argon gas supply path 63 is connected to an argon gas supply source 75. Further, in the argon gas supply path 63, a flow rate adjusting valve 76, which is capable of performing an open/close operation of the argon gas supply path 63 and controlling a supply flow rate of the argon gas, is installed. The nitrogen gas supply path 64 is connected to a nitrogen gas supply source 77. Further, in the nitrogen gas supply path 64, a flow rate adjusting valve 78, which is capable of performing an open/close operation of the nitrogen gas supply path 64 and controlling a supply flow rate of the nitrogen gas, is installed.

The exhaust mechanism 44 includes an exhaust path 85 in which an open/close valve 82 and an exhaust pump 83 for performing forced exhaust are installed. An end opening part of the exhaust path 85 is opened at a lower portion of the chamber 40.

Moreover, operations of respective parts such as the gate valve 54, the temperature controller 55, the flow rate adjusting valves 72, 74, 76 and 78, the open/close valve 82, the exhaust pump 83 and so forth in the COR processing apparatus 5 are controlled by control commands of the controller computer 8, respectively. In other words, the controller computer 8 controls the supply of the hydrogen fluoride gas, the ammonia gas, the argon gas and the nitrogen gas by the supply mechanism 43, the exhaust by the exhaust mechanism 44, the temperature control by the temperature controller 55 and so forth.

Each of functional components of the processing system 1 is connected to the controller computer 8 which automatically controls an overall operation of the processing system 1 through respective signal lines. Here, the functional components refer to every component which are operated to fulfill predetermined process conditions, for example, the wafer transfer mechanism 11, the wafer transfer mechanism 17, the gate valve 22 of the PHT processing apparatus 4, the flow rate adjusting valve 31, the exhaust pump 33, the gate valve 54 of the COR processing apparatus 5, the temperature controller 55, the flow rate adjusting valves 72, 74, 76 and 78, the open/close valve 82, the exhaust pump 83 and so forth which are described above. The controller computer 8 is typically a general-purpose computer which is capable of realizing a certain function using executable software.

Figure 3:
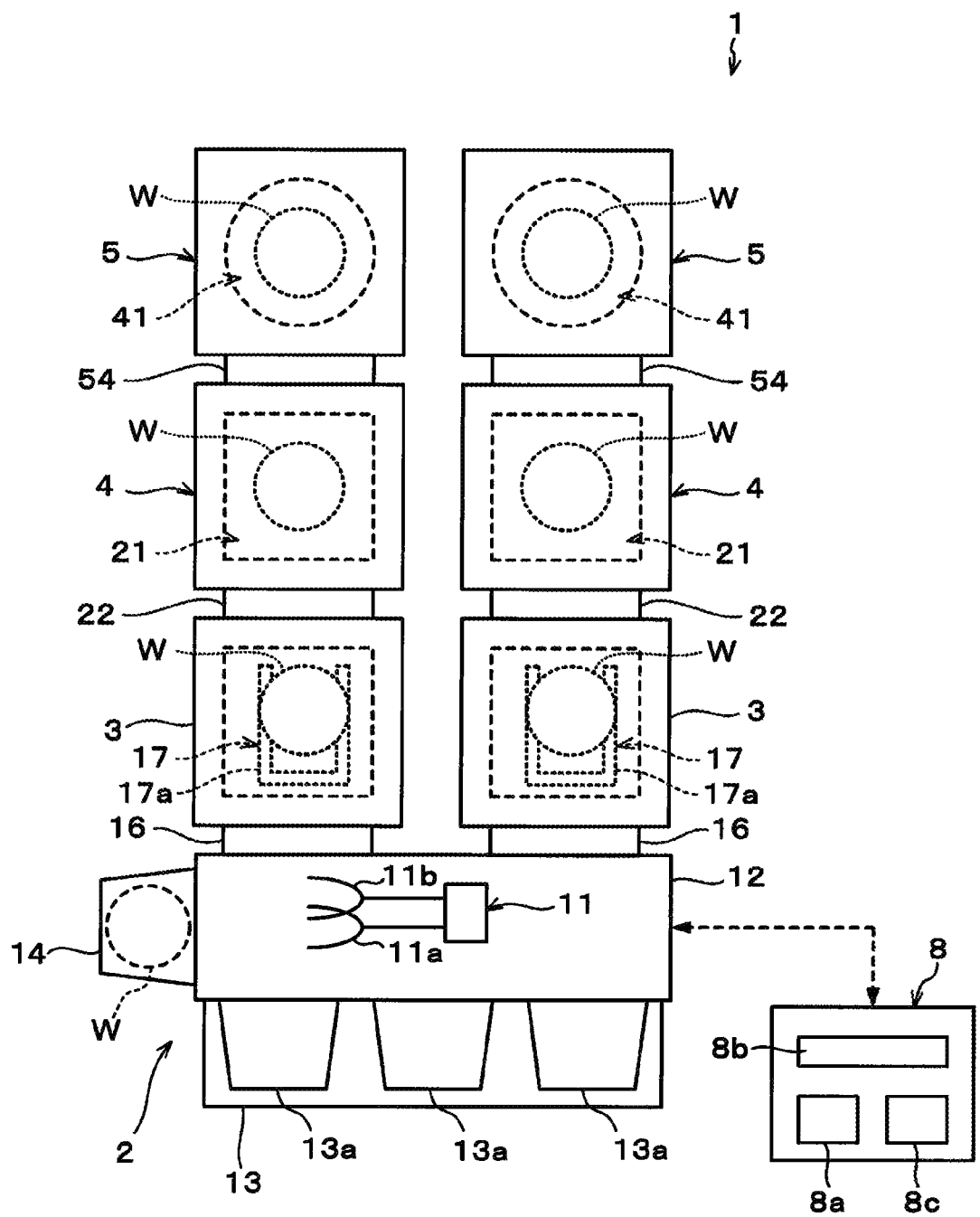
FIG. 3 is a schematic plan view of a processing system.

As shown in FIG. 3, the controller computer 8 includes a calculation part 8a having a central processing unit (CPU), an input/output part 8b connected to the calculation part 8a, and a recording medium 8c inserted into the input/output part 8b and storing a control software. In the recording medium 8c, a control software (program), which is executed by the controller computer 8 and causes a predetermined substrate processing method (to be described later) to be performed in the processing system 1, is recorded. By executing the control software, the controller computer 8 controls the respective functional components of the processing system 1 to realize the various process conditions (e.g., a pressure of the processing chamber 41, etc.) defined by a predetermined process recipe. In other words, as described in detail later, a control command for realizing an etching method in which the COR process in the COR processing apparatus 5 and the PHT process in the PHT processing apparatus 4 are performed in this order, is provided.

The recording medium 8c may be fixedly installed in the controller computer 8, or detachably installed to a reading device (not shown) installed in the controller computer 8 so as to be read by the reading device. As a most typical embodiment, the recording medium 8c is a hard-disc drive in which a control software is installed by a service man of a manufacturer of the processing system 1. In another embodiment, the recording medium 8c is a removable disc such as a CD-ROM or a DVD-ROM in which the control software is recorded. Such a removable disc is read by an optical reading device (not shown) installed in the controller computer 8. Moreover, the recording medium 8c may be one type of a random access memory (RAM) or a read only memory (ROM). Further, the recording medium 8c may be a cassette type ROM. That is, any medium known in the field of computer technology may be used as the recording medium 8c. In addition, in a factory where a plurality of processing systems 1 is arranged, the control software may be stored in a management computer for collectively controlling the controller computer 8 of the respective processing systems 1. In this case, each of the processing systems 1 is operated by the management computer through a communication line so as to execute a predetermined process.

Next, a processing method of the wafer W performed in the processing system 1 having a configuration described above, will be described. First, as shown in FIG. 1, the wafer W in which the contact hole H is formed in the HDP-SiO$_2$ film 101 is received in the carrier 13a and is transferred to the processing system 1.

In the processing system 1, as shown in FIG. 3, the carrier 13a accommodating a plurality of the wafers W is mounted on the mounting table 13. One sheet of the wafer W is taken out from the carrier 13a by the wafer transfer mechanism 11, and then loaded into the load lock chamber 3. After the wafer W is loaded in the load lock chamber 3, the load lock chamber 3 is sealed and depressurized. Thereafter, the gate valves 22 and 54 are opened, and the load lock chamber 3, the processing chamber 21 of the PHT processing apparatus 4 and the processing chamber 41 of the COR processing apparatus 5 communicate with one another, wherein the processing chambers 21 and 41 are in a state depressurized below atmospheric pressure. The wafer W is taken out from the load lock chamber 3 by the wafer transfer mechanism 17, and moves in a straight line so as to pass into the loading/unloading gate (not shown) of the processing chamber 21, the processing chamber 21, and the loading/unloading gate 53 in this order, thereby being loaded into the processing chamber 41.

In the processing chamber 41, the wafer W is transferred to the mounting table 42 from the transfer arm 17a of the wafer transfer mechanism 17 in a state that the device formation surface of the wafer W faces upward. After the wafer W is loaded, the transfer arm 17a is retracted from the processing chamber 41, and the loading/unloading gate 53 is closed, so that the processing chamber 41 is sealed. Subsequently, the COR process starts.

After the processing chamber 41 is sealed, the ammonia gas, the argon gas and the nitrogen gas are supplied to the processing chamber 41 from the ammonia gas supply path 62, the argon gas supply path 63, and the nitrogen gas supply path 64, respectively. Moreover, a pressure within the processing chamber 41 is controlled to be in a low pressure state lower than atmospheric pressure. Further, a temperature of the wafer W on the mounting table 42 is controlled to a predetermined target value (e.g., about 35 degrees C.) by the temperature controller 55.

Thereafter, the hydrogen fluoride gas is supplied from the hydrogen fluoride gas supply path 61 to the processing chamber 41. Herein, by supplying the hydrogen fluoride gas to the processing chamber 41 in which the ammonia gas has been previously supplied, an atmosphere of the processing chamber 41 becomes a processing atmosphere of a mixture gas including the hydrogen fluoride gas and the ammonia gas. In this way, by supplying the mixture gas onto the surface of the wafer W in the processing chamber 41, a first COR process (a first modification step) is performed on the wafer W.

Figure 2:
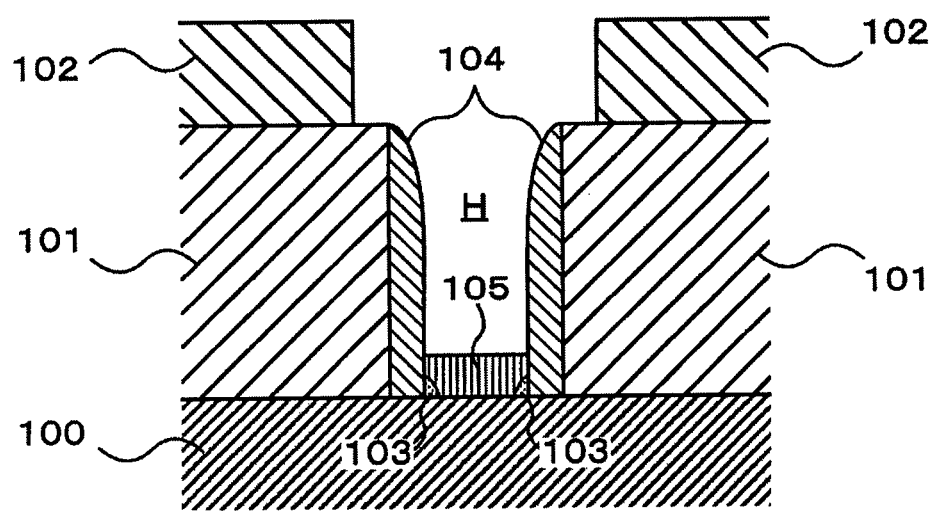
FIG. 2 is a schematic vertical sectional view illustrating a condition of a surface of a wafer when a conventional etching method is used.

Due to the processing atmosphere of the low pressure state within the processing chamber 41, the sacrificial oxide film 103 existing in the lower portion of the contact hole H of the wafer W chemically reacts with hydrogen fluoride gas molecules and ammonia gas molecules of the mixture gas, thereby being modified to the reaction product 105 (see, FIG. 2). As the reaction product 105, ammonium fluorosilicate, water or the like is generated. Further, this chemical reaction progresses isotropically, so that it occurs from the lower portion of the contact hole H to the top surface of the Si layer 100.

During the first COR process, a pressure of the mixture gas (the processing atmosphere) is preferably maintained at a pressure ranging from equal to or higher than 20 mTorr, which is a pressure lower than atmospheric pressure, to equal to or lower than 600 mTorr (e.g., about 2.7 to about 80.0 Pa) by adjusting the supply flow rates of the respective processing gases, the supply flow rate of the inert gas, the exhaust flow rate and so forth. Moreover, a partial pressure of the hydrogen fluoride gas within the mixture gas is preferably adjusted to fall within a range from equal to or higher than 5 mTorr to equal to or lower than 200 mTorr (e.g., about 0.7 to about 26.7 Pa). Further, a temperature of the mixture gas (the processing atmosphere) is preferably adjusted to fall within a range from equal to or higher than 20 degrees C. to equal to or lower than 120 degrees C. More preferably, it is adjusted to fall within a range from equal to or higher than 35 degrees C. to equal to or lower than 45 degrees C. In addition, the flow rate of the mixture gas is preferably set to about three times of the flow rate of the hydrogen fluoride gas. A flow rate of the hydrogen fluoride gas is preferably adjusted to fall within a range from equal to or higher than 100 sccm to equal to or lower than 500 sccm. Moreover, in principle, a processing time of the first COR process is changed depending on a thickness of the sacrificial oxide film 103. However, considering performing a second COR process described later, it is not preferable for the processing time to be lengthened in a viewpoint of productivity. For these reasons, the processing time of the first COR process is preferably set to be equal to or lower than 60 sec.

Moreover, a temperature of the wafer W, i.e., a temperature of a portion where a chemical reaction occurs in the sacrificial oxide film 103 (a temperature of a portion where the sacrificial oxide film 103 makes contact with the mixture gas), may be maintained at a constant temperature, e.g., about equal to or higher than 35 degrees C. In this way, the chemical reaction is accelerated and a generation rate of the reaction product 105 is increased, whereby a layer of the reaction product 105 can be formed rapidly. Further, a sublimation point of the ammonium fluorosilicate within the reaction product 105 is about 100 degrees C. If the temperature of the wafer W is equal to or higher than 100 degrees C., there is a possibility that producing the reaction product 105 is not favorably performed. For that reason, the temperature of the wafer W is preferably set to be equal to or lower than 100 degrees C.

By performing the first COR process for a predetermined time in this way, the sacrificial oxide film 103 is modified and the reaction product 105 is generated. However, as the processing time advances, the thickness of the reaction product 105 is getting thicker, so that a rate at which the mixture gas passes through the reaction product 105 is decreased. Therefore, the amount of the mixture gas contacting the sacrificial oxide film 103 is decreased and a modification amount of the sacrificial oxide film 103 is decreased. In particular, a peripheral portion of the lower portion of the contact hole H stays in a state where it has more unmodified sacrificial oxide film 103 than the central portion thereof.

Figure 6:
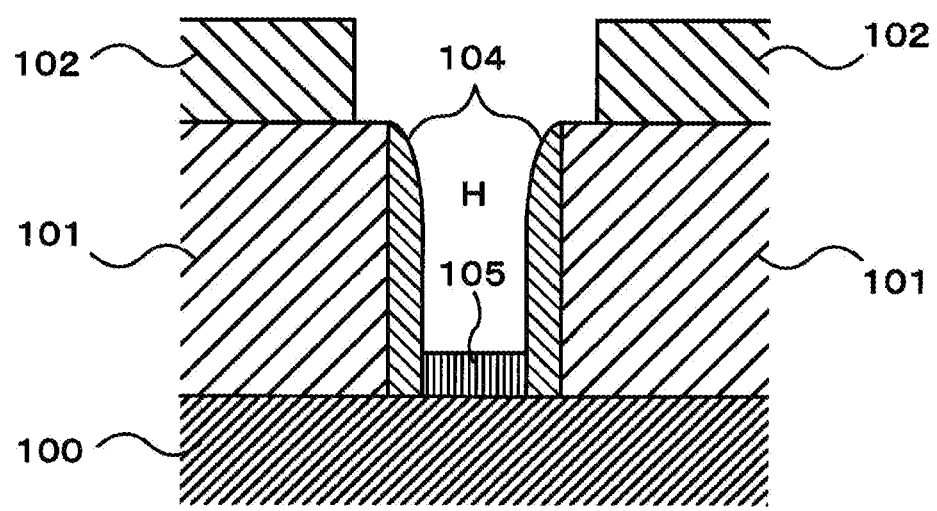
FIG. 6 is a schematic vertical sectional view illustrating a condition of a surface of a wafer when an etching method according to an embodiment of the present disclosure is used.

Therefore, in the present embodiment, after performing the first COR process, the second COR process (a second modification step) is further performed to the wafer W. In other words, after performing the first COR process for the predetermined time, the supply of the ammonia gas into the processing chamber 41 is stopped, the modification process of the sacrificial oxide film 103 is performed by constituting the mixture gas supplied into the processing chamber 41 with the hydrogen fluoride gas, the argon gas, and the nitrogen gas. In this way, the mixture gas easily passes through the reaction product 105 (ammonium fluorosilicate) generated during the first COR process and easily makes contact with the unmodified sacrificial oxide film 103. At this time, the hydrogen fluoride gas within the mixture gas passing through the reaction product 105 reacts with ammonia component within the reaction product 105, thereby becoming a reaction gas modifying the sacrificial oxide film 103. With the contact between the reaction gas and the sacrificial oxide film 103, the sacrificial oxide film 103, which could not be modified during the first COR process, is uniformly and sufficiently modified as shown in FIG. 6.

The reason why the ammonia gas is stopped during the second COR process is that, if the ammonia gas is supplied, a new reaction product 105 is deposited on the surface of the reaction product (ammonium fluorosilicate), so that a passing rate of the mixture gas becomes slower. Meanwhile, if the ammonia gas is stopped, the new reaction product 105 is not generated on the surface of the reaction product 105, so that the mixture gas including the hydrogen fluoride gas easily passes through the reaction product.

Moreover, during the second COR process, a pressure of the mixture gas (the processing atmosphere) is preferably set to be higher than the pressure of the first COR process by adjusting the supply flow rates of the respective processing gases, the supply flow rate of the inert gas, the exhaust flow rate and so forth. Specifically, it is preferable that a pressure difference between the mixture gas (the processing atmosphere) of the second COR process and the mixture gas (the processing gas) of the first COR process is set to fall within a range from equal to or higher than 100 mTorr to equal to or lower than 200 mTorr (about 13.3 to about 26.7 Pa). By setting the pressure of the processing atmosphere of the second COR process to a pressure higher than the pressure of the processing atmosphere of the first COR process in this way, the rate at which the mixture gas passes through the reaction product 105 is increased, so that the sacrificial oxide film 103 is uniformly and sufficiently modified. It is preferable that other processing conditions are the same as the first COR process.

However, in the COR process, since the $HDP\text{-}SiO_2$ film 101 can chemically react with the mixture gas, there is concern that the $HDP\text{-}SiO_2$ film 101 is modified. In order to suppress the modification of the $HDP\text{-}SiO_2$ film 101, a partial pressure of the ammonia gas within the mixture gas should be lower than a partial pressure of the hydrogen fluoride gas. In other words, the supply flow rate of the ammonia gas should be lower than the supply flow rate of the hydrogen fluoride gas. By doing so, the chemical reaction can be prevented in the $HDP\text{-}SiO_2$ film 101 while the chemical reaction actively occurs in the sacrificial oxide film 103. In other words, only of the sacrificial oxide film 103 can be selectively and efficiently modified while suppressing the modification of the $HDP\text{-}SiO_2$ film 101 and so forth. Therefore, a damage of the $HDP\text{-}SiO_2$ film 101 can be prevented. By adjusting the partial pressure of the ammonia gas within the mixture gas in this way, it is possible to make differences in the reaction speed of the chemical reaction, the production amount of the reaction product 105 and so forth, between the sacrificial oxide film 103 and the $HDP\text{-}SiO_2$ film 101, which are all silicon oxide film but are different in density, composition, film forming method and so forth. Furthermore, an etching amount after performing the PHT process described later can be made different from each other. In addition, it is thought that the chemical reaction when the partial pressure of the ammonia gas is lower than the partial pressure of the hydrogen fluoride gas is not a reaction rate control meaning that the generation rate of the reaction product 105 is determined by the chemical reaction of the sacrificial oxide film 103 and the mixture gas, but a supply rate control meaning that the generation rate of the reaction product 105 is determined by the supply flow rate of the hydrogen fluoride gas.

When a layer of the reaction product 105 is sufficiently formed and the second COR process is ended, the processing chamber 41 is depressurized by performing forced exhaust. As a result, the hydrogen fluoride gas or the ammonia gas is forcibly discharged from the processing chamber 41. When the forced exhaust of the processing chamber 41 is ended, the loading/unloading gate 53 is opened, the wafer W is unloaded from the processing chamber 41 by the wafer transfer mechanism 17 and then is loaded to the processing chamber 21 of the PHT processing apparatus 4. In this way, the COR process is finished.

In the PHT processing apparatus 4, the wafer W is mounted within the processing chamber 21 in a state that the device formation surface of the wafer W faces upward. When the wafer W is loaded, the transfer arm 17a is retracted from the processing chamber 21, the processing chamber 21 is sealed, and then PHT process is started. In the PHT process, while the processing chamber 21 is exhausted, a heating gas having a high temperature is supplied into the processing chamber 21, so that a temperature of the processing chamber 21 is increased. In this way, the reaction product 105 generated by the COR process is heated, vaporized, and discharged outside the wafer W from a lower side of the contact hole H through an inside of the contact hole. By performing the PHT process after the COR process in this way, the reaction product 105 is removed, so that the sacrificial oxide film 103 can be isotropically dry-etched.

After the PHT process ends, the supply of the heating gas is stopped and then the loading/unloading gate of the PHT processing apparatus 4 is opened. After that, the wafer W is unloaded from the processing chamber 21 by the wafer transfer mechanism 17, and then is returned to the load lock chamber 3. The PHT process in the PHT processing apparatus 4 is finished in this manner.

After the wafer W is returned to the load lock chamber 3 and the load lock chamber 3 is sealed, the load lock chamber 3 and the transfer chamber 12 are communicated with each other. Then, by the wafer transfer mechanism 11, the wafer W is unloaded from the load lock chamber 3, and is returned to the carrier 13a on the mounting table 13. In this way, a series of etching process in the processing system 1 is finished.

According to the embodiment, by performing the COR process (the second modification step) in which the ammonia gas is stopped after the conventional COR process (the first modification step), the sacrificial oxide film 103 formed in the lower portion of the contact hole H can be uniformly and sufficiently modified. As a result, the generated reaction product 105 is sublimated during the PHT process (the heating process) and thus removing the sacrificial oxide film 103 is possible without permitting the same to remain. In other words, the sacrificial oxide film can be uniformly and sufficiently removed without repeatedly performing the modification process and the heating process several times.

While the preferred embodiments of the present disclosure have been described, the present disclosure is not limited to these examples. It is clear that a person skilled in the art can reach various modifications without departing from the scope of the technical ideas described in claims, and such modifications would fall within a technical scope of the present disclosure.

The types of gases supplied into the processing chamber 41 except the hydrogen fluoride gas and the ammonia gas are not limited to the combination described in the above embodiments. For example, the inert gas supplied into the processing chamber 41 may be argon gas only. Moreover, such an inert gas may be another inert gas, for example, any one of helium (He) gas and xenon (Xe) gas, or a mixture of two or more gases among the argon gas, the nitrogen gas, the helium gas and the xenon gas.

Figure 7:
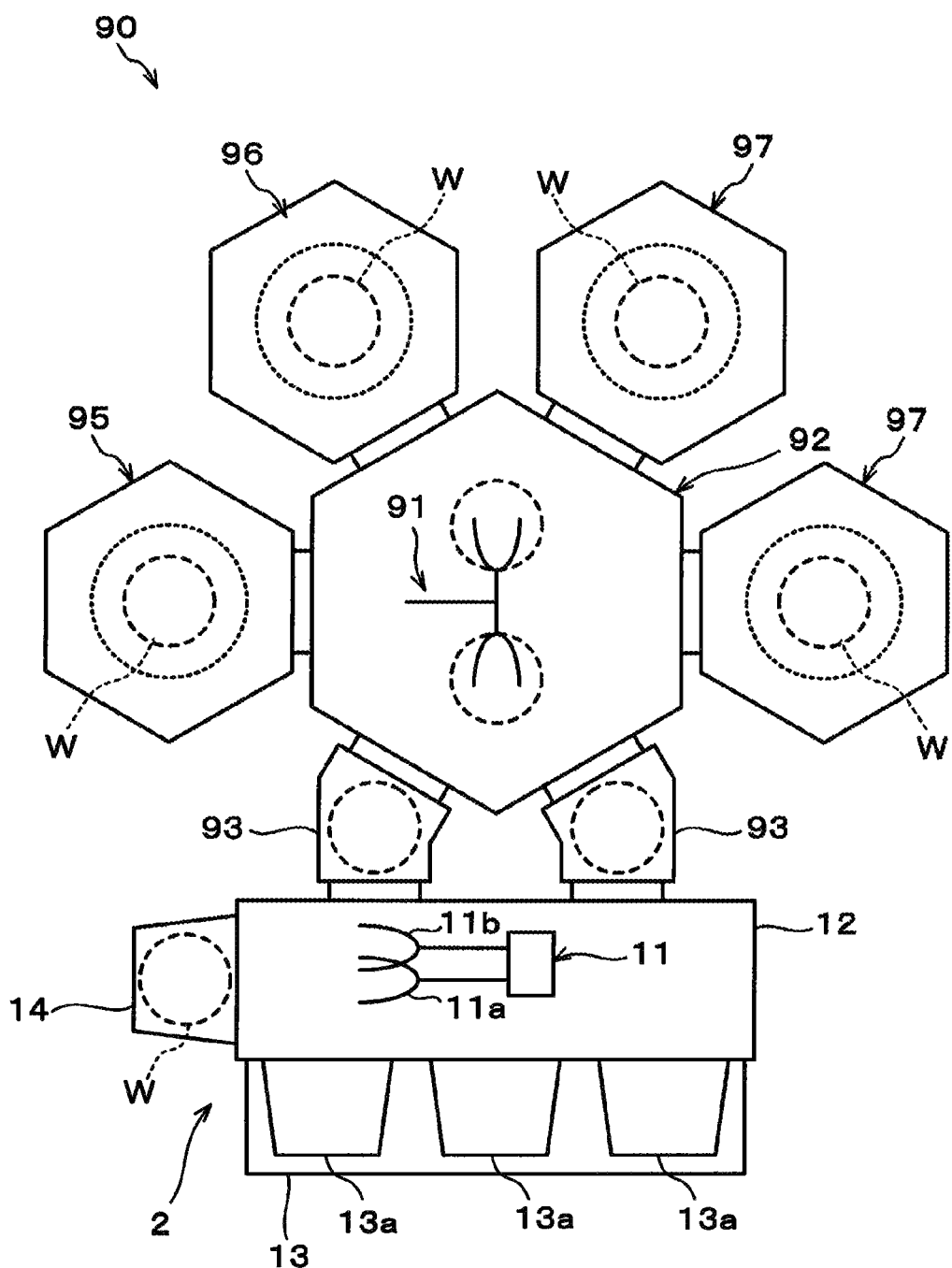
FIG. 7 is a schematic plan view of a processing system according to another embodiment of the present disclosure.

A structure of the processing system 1 is not limited to those mentioned in the above embodiments. For example, instead of the COR processing apparatus and the PHT processing apparatus, a processing system including a film forming apparatus may be used. For example, like a processing system 90 shown in FIG. 7, a configuration may be possible, in which a common transfer chamber 92 including a wafer transfer mechanism 91 is connected to the transfer chamber 12 through load lock chambers 93, and a COR processing apparatus 95, a PHT processing apparatus 96, and film forming apparatuses 97 such as CVD apparatus and so forth are arranged around the common transfer chamber 92. In the processing system 90, the wafer W is loaded/unloaded with respect to each of the load lock chambers 93, the COR processing apparatus 95, the PHT processing apparatus 96 and the film forming apparatus 97 by the wafer transfer mechanism 91. An interior of the common transfer chamber 92 can be vacuumized. In other words, by keeping the interior of the common transfer chamber 92 in a vacuum-state, the wafer W unloaded from the PHT processing apparatus 96 can be loaded into the film forming apparatus 97 without making contact with oxygen within air.

In the above embodiments, the silicon wafer W that is a semiconductor wafer is provided as the substrate having the silicon oxide film. However, the substrate is not limited to this and different types, for example, glass for an LCD substrate, a CD substrate, a printed substrate, a ceramic substrate and so forth may be used as the substrate.

Moreover, a structure of the substrate processed in the processing system 1 is not limited those described in the above embodiments. Further, the etching performed in the processing system 1 is not limited to the etching performed on the lower portion of the contact hole H as shown in the embodiments, and the present disclosure may be applied to etching methods for various parts.

In the processing system 1, the silicon oxide film, which is an object on which the etching is performed, is not limited to the sacrificial oxide film. The silicon oxide film may be other types of silicon oxide films, e.g., a HDP-$SiO_2$ film and so forth. Even in this case, the etching amount and so forth can be controlled by adjusting a temperature of the silicon oxide film in the COR process and a partial pressure of the hydrogen fluoride gas within the mixture gas according to the types of the silicon oxide film.

Moreover, regarding the CVD-based oxide film formed on the substrate, the types of CVD-method used to form the CVD-based oxide film are not specifically limited. For example, a thermal-CVD method, a normal pressure CVD-method, a low pressure CVD-method, a plasma CVD method and so forth may be used.

Figure 8A:
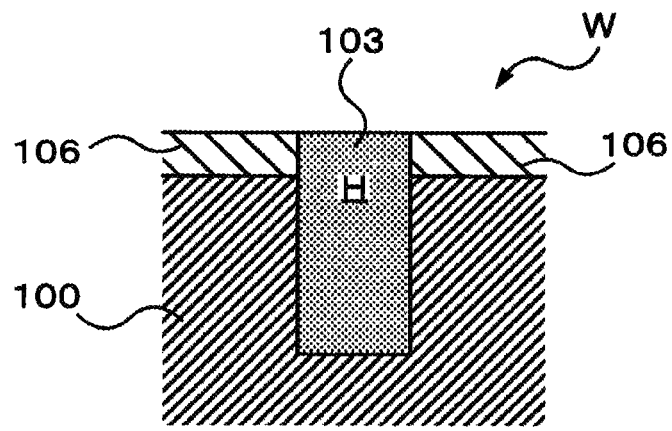
FIGS. 8A to 8C are schematic vertical sectional views illustrating a structure of a surface of a wafer according to another embodiment.
Figure 8B:
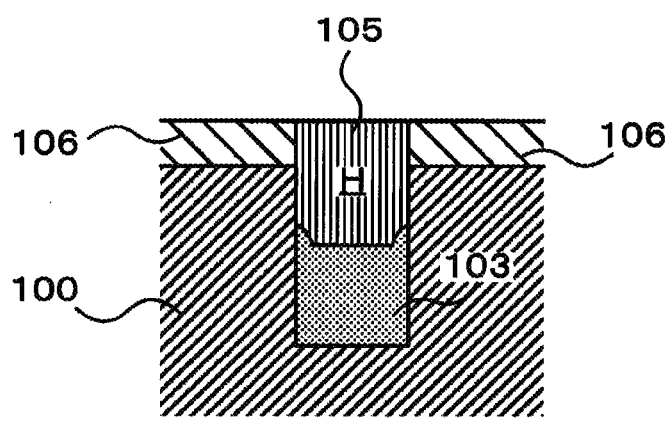
Figure 8C:
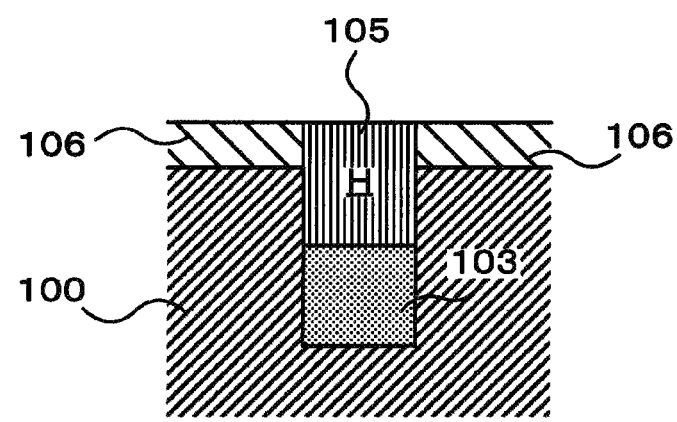

While modifying the sacrificial oxide film 103 in the lower portion of the contact hole H has been described in the above embodiments, the COR process according to the present disclosure can be applied to, for example, an etch-back process of the oxide film 103 as shown in the FIGS. 8A to 8C. FIG. 8A is a diagram illustrating a state of a silicon wafer W of, for example, a manufacturing process of a recess transistor. As shown in FIG. 8A, a groove H is formed in the wafer W, and a film 106 (e.g., SiN film) for protecting the wafer W when performing etch-back is formed in a surface of a convex portion of the wafer W.

In etching-back the oxide film 103 up to the middle of the groove H in the wafer W described above, according to the conventional COR process, the oxide film 103 is more difficult to be modified in a peripheral portion of the groove H on a surface of the oxide film 103 than in a central portion of the groove H, as shown in FIG. 8B. In this case, it was impossible to only modify the oxide film 103 in the peripheral portion of the groove H in the conventional processing method, so that a transfer to the subsequent process was performed in a state that a surface shape of the oxide film 103 is in disorder. However, by performing the second COR process according to the present disclosure, the central portion and the peripheral portion in the surface of the oxide film are uniformly modified, so that the surface shape can be flat as shown in FIG. 8C.

EXAMPLE

The etching process (the first COR process, the second COR process, and the PHT process) according to the present disclosure was performed on the wafer W (the wafer corresponds to the structure shown in FIG. 1) having a sacrificial oxide film of about 13 nm formed in the lower portion of the contact hole. Moreover, in the present example, the first COR process was performed for 60 sec, and then the second COR process was performed for 60 sec. Further, the first COR process is performed under a processing atmosphere having a pressure of 50 mTorr and a temperature of 35 degrees C., and the second COR process is performed under a processing atmosphere having a pressure of a 150 mTorr and a temperature of 35 degrees C.

A relationship between a COR processing time and an etching amount of the oxide film when the etching process is performed in the processing condition described above is shown in FIG. 9. Further, in FIG. 9, a relationship between a COR processing time and an etching amount of the oxide film when only the first COR process (the conventional COR process) is performed is also shown. In addition, the modification of the oxide film does not progress in a totally-uniform-state, and thus the "etching amount" used herein refers to an average etching amount. The average etching amount refers to an average of differences between the film thickness measured in a plurality of points in the grooves on the wafer before the etching and the film thickness measured after the etching.

Figure 9:
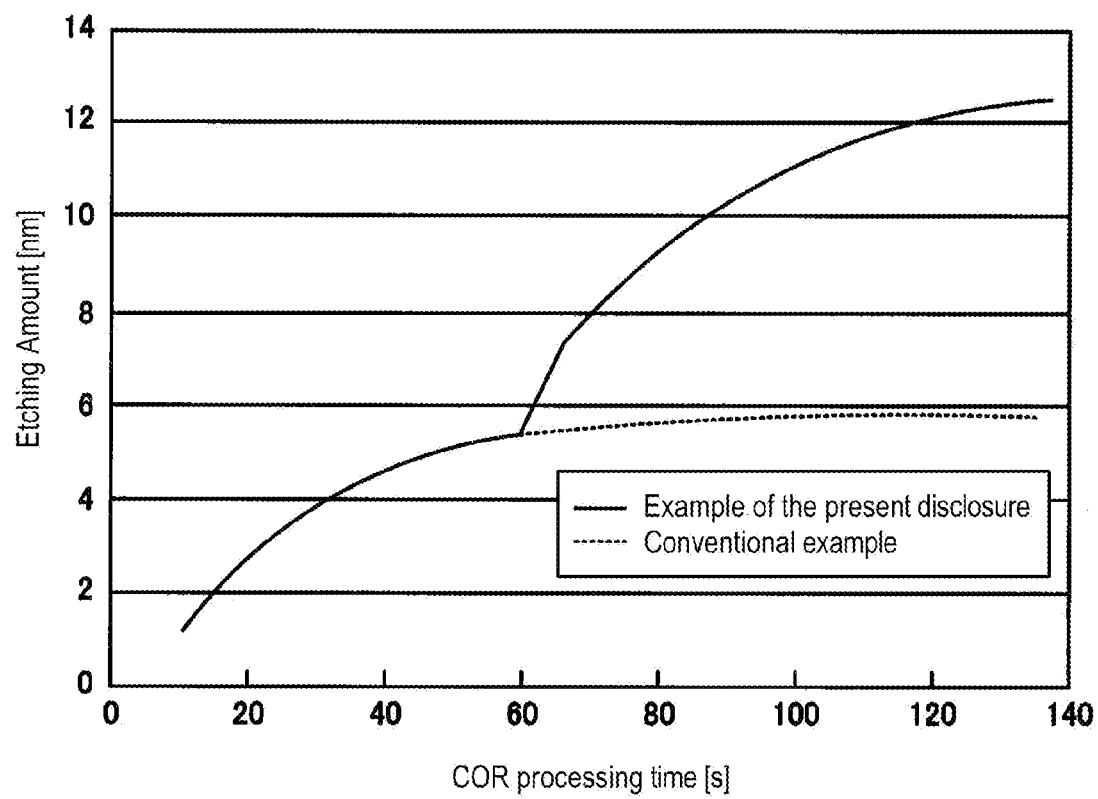
FIG. 9 is a diagram illustrating a relationship between a COR processing time and an etching amount of an oxide film related to an example.

According to the result of FIG. 9, in the etching process which only performs the first COR process (the conventional COR process), a state where, although the processing time is lengthened, the etching amount is not increased, i.e., a state where the modification reaction of the oxide film is saturated in the COR process was confirmed. On the other hand, if the second COR process is performed after performing the first COR process for 60 sec, it is possible to confirm that the etching amount of the oxide film in the saturation state is increasing again.

In this example, in the case where the first COR process was performed for 60 sec, the etching amount of the oxide film was 5.23 nm. On the other hand, in the case where the second COR process was performed for 60 sec after the first COR process, the etching amount of the oxide film was 12.13 nm. In other words, it was confirmed, from the result of the present example, that performing the second COR process after the first COR process can remove the oxide film more than a case where only the first COR process is performed. Further, while the etching amount is decreased by increasing the processing time of the second COR process, it is assumed that this was because most of the oxide film to be removed has been already etched.

INDUSTRIAL APPLICABILITY

The present disclosure is applicable to an etching process and a recording medium.

EXPLANATION OF REFERENCE NUMERALS

W: wafer, H: groove, 1: processing system, 4: PHT processing system, 5: COR processing system, 8: controller computer, 40: chamber, 41: processing chamber, 61: hydrogen fluoride gas supply path, 62: ammonia gas supply path, 85: exhaust path, 100: Si layer, 101: HDP-$SiO_2$ film, 102: resist film, 103: oxide film, 104: SiN film (side wall portion), 105: reaction product, 106: SiN film

What is claimed is:

1. An etching process comprising:
    a modification process of supplying a mixture gas to a surface of a silicon oxide film to cause a chemical reaction between the silicon oxide film and the mixture gas, and modifying the silicon oxide film to generate a reaction product; and
    a heating process of heating and removing the reaction product,
    wherein the modification process includes:
        a first modification process of supplying the mixture gas containing a gas including a halogen element and an alkaline gas to the surface of the silicon oxide film; and
        a second modification process of stopping supplying the alkaline gas and supplying the mixture gas containing the gas including the halogen element to the surface of the silicon oxide film.

2. The etching process of claim 1, wherein the gas including the halogen element is a hydrogen fluoride gas and the alkaline gas is an ammonia gas.

3. The etching process of claim 1, wherein a pressure of the mixture gas in the second modification process is higher than a pressure of the mixture gas in the first modification process.

4. The etching process of claim 3, wherein a difference between the pressure of the mixture gas in the second modification process and the pressure of the mixture gas in the first modification process is set to fall within a range from equal to or higher than 100 mTorr to equal to or lower than 200 mTorr.

5. The etching process of claim 1, wherein a pressure of the mixture gas in the first modification process is set to fall within a range from equal to or higher than 20 mTorr to equal to or lower than 600 mTorr.

6. The etching process of claim 1, wherein a partial pressure of a hydrogen fluoride gas within the mixture gas in the first modification process is set to fall within a range from equal to or higher than 5 mTorr to equal to or lower than 200 mTorr.

7. The etching process of claim 1, wherein a flow rate of a hydrogen fluoride gas in the first modification process is set to fall within a range from equal to or higher than 100 sccm to equal to or lower than 500 sccm.

8. The etching process of claim 1, wherein a temperature of the mixture gas in the modification process is set to fall within a range from equal to or higher than 20 degrees C. to equal to or lower than 120 degrees C.

9. The etching process of claim 1, wherein the silicon oxide film is formed in a lower portion of a groove formed in a silicon wafer.

10. The etching process of claim 1, wherein the silicon oxide film is a sacrificial oxide film.

11. A recording medium storing a program which can be executed by a controller computer of a processing system, wherein the program is executed by the controller computer to cause the etching method of claim 1 to be performed in the processing system.

* * * * *